(12) United States Patent
Matsushima

(10) Patent No.: US 11,117,394 B2
(45) Date of Patent: Sep. 14, 2021

(54) LIGHT IRRADIATION DEVICE AND IMAGE FORMING DEVICE

(71) Applicant: Ushio Denki Kabushiki Kaisha, Tokyo (JP)

(72) Inventor: Takeo Matsushima, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/754,740

(22) PCT Filed: Aug. 22, 2018

(86) PCT No.: PCT/JP2018/030944
§ 371 (c)(1),
(2) Date: Apr. 8, 2020

(87) PCT Pub. No.: WO2019/073696
PCT Pub. Date: Apr. 18, 2019

(65) Prior Publication Data
US 2020/0316964 A1     Oct. 8, 2020

(30) Foreign Application Priority Data

Oct. 10, 2017  (JP) .............................. JP2017-196875

(51) Int. Cl.
*B41J 11/00*      (2006.01)
*F21K 9/69*       (2016.01)

(52) U.S. Cl.
CPC .............. *B41J 11/002* (2013.01); *F21K 9/69* (2016.08)

(58) Field of Classification Search
CPC .. B41J 11/002; B41J 2/01; B41J 29/00; F21K 9/69; B01J 19/12; H01L 33/00
See application file for complete search history.

(56) References Cited

U.S. PATENT DOCUMENTS

2017/0191650 A1*  7/2017  Kobayashi ............ F21V 29/505
2017/0205062 A1   7/2017  Watanabe

FOREIGN PATENT DOCUMENTS

JP     2004-167718 A    6/2004
JP     2015-122485 A    7/2015
(Continued)

OTHER PUBLICATIONS

Notification of Transmittal of Translation of the International Preliminary Report on Patentability (Chapter I) and Translation of Written Opinion of the International Searching Authority; PCT/JP2018/030944; dated Apr. 23, 2020.
(Continued)

*Primary Examiner* — Bradley W Thies
(74) *Attorney, Agent, or Firm* — Studebaker & Brackett PC

(57) ABSTRACT

This light irradiation device is provided with: an LED substrate, on which a plurality of LED chips that emit ultraviolet light are arrayed in a first direction; and a cover capable of transmitting the ultraviolet light emitted from the LED chips. When a plane, on which an intersection point that the light emitted from the LED chips positioned at both ends in the first direction reach is positioned, said plane being parallel to an LED substrate surface, is specified as a reference plane Z1, the distance between the LED substrate surface and the reference plane Z1 is represented by D (mm), and the distance between the LED substrate surface and a cover outer surface is represented by W (mm), W satisfies formula W<D.

7 Claims, 6 Drawing Sheets

(56) References Cited

FOREIGN PATENT DOCUMENTS

| | | |
|---|---|---|
| JP | 2017-126534 A | 7/2017 |
| WO | 2014/065081 A1 | 5/2014 |
| WO | 2017/158943 A1 | 9/2017 |

OTHER PUBLICATIONS

International Search Report issued in PCT/JP2018/030944; dated Oct. 9, 2018.
Office Action issued in JP 2017-196875; mailed by the Japanese Patent Office dated Aug. 28, 2019.
Office Action issued in JP 2017-196875; mailed by the Japanese Patent Office dated Oct. 29, 2019.

* cited by examiner

LIGHT IRRADIATION DEVICE AND IMAGE FORMING DEVICE

TECHNICAL FIELD

The present invention relates to a light irradiation device and an image forming device.

BACKGROUND ART

Conventionally, as an image forming device, there is a UV printing device including an ejection device that ejects UV ink curable by ultraviolet rays and a light irradiation device that irradiates the UV ink with the ultraviolet rays.

In the UV printing device, the UV ink is ejected from the ejection device onto a workpiece (for example, paper), and the ejected UV ink is irradiated with the ultraviolet rays to cure the UV ink, thereby forming (printing) a desired image.

Conventionally, a discharge lamp that emits the ultraviolet rays is used as the light irradiation device used in the UV printing device. However, in recent years, a configuration in which an LED light source is used instead of the lamp is adopted because of advantages such as low energy consumption and a long life. The LED light source in which a plurality of LED chips are arrayed in a matrix form is used (for example, see Patent Document 1).

PRIOR ART DOCUMENT

Patent Document

Patent Document 1: JP-A-2017-126534

SUMMARY OF THE INVENTION

Problems to be Solved by the Invention

FIG. 7 is a sectional view illustrating the light irradiation device included in the conventional image forming device. As illustrated in FIG. 7, a conventional light irradiation device 120 includes a chassis 122, an LED substrate 124 provided inside and in an upper portion of the chassis 122, and a cover 130 provided to cover a bottom surface of the chassis 120. On the LED substrate 124, a plurality of LED chips 126 that emit ultraviolet rays are arrayed in a workpiece conveyance direction. In the light irradiation device 120, a plane (reference plane $Z_1$) on which an intersection point $O_1$ at which light from each of the LED chips 126 located at both ends in the workpiece conveyance direction reaches is located, the plane being parallel to a surface of the LED substrate 124, is located on the inside (the side of the LED 124) of the chassis 122 with respect to the cover 130. The reference plane $Z_1$ in the conventional light irradiation device means the plane on which the intersection point $O_1$ at which the light from each of the LED chips located at both ends in the workpiece conveyance direction reaches is located and is parallel to an LED substrate surface.

FIG. 7 includes a graph illustrating a relationship between a distance from the LED substrate 124 and illuminance at a central position M (a central position M in the workpiece conveyance direction) of the LED substrate 124 together with a schematic diagram of the light irradiation device 120. In the graph, a distance from the substrate is expressed so as to be matched with the distance from the LED substrate 124 of the illustrated light irradiation device 120. As can be seen from the graph, the illuminance at the central position M is kept constant from the surface of the LED substrate 124 to the reference plane $Z_1$. On the other hand, below the reference plane $Z_1$ (on the side away from the LED substrate 124), the illuminance decreases according to the distance. When the conventional light irradiation device 120 is used, the workpiece passes below the cover 130. For this reason, the illuminance of the light with which the workpiece is irradiated changes when the position at which the workpiece passes fluctuates in the height direction (the direction perpendicular to the conveyance direction) at the central position M. The inventors have ascertained such facts as a result of intensive studies.

In the conventional light irradiation device 120, the reason why the reference plane $Z_1$ is located on the inside of the chassis 122 with respect to the cover 130 is that the light emitted from the LED chip 126 has a wide divergence angle.

There is an image forming device that performs printing while the workpiece is conveyed. In the image forming device, the workpiece may be fluttered in a direction perpendicular to a workpiece surface when the workpiece is conveyed. For example, when the workpiece flutters with a fluctuation range of 1 mm immediately below the light irradiation device (the location having the highest illuminance in the conveyance direction), the distance between the workpiece and the light irradiation device changes with the fluctuation range of 1 mm when the workpiece passes directly below the light irradiation device. In this case, in the conventional light irradiation device, there is a problem in that the illuminance of the light with which the workpiece is irradiated changes in the conveyance direction.

There is also an image forming device that performs printing while moving the ejection device and the light irradiation device instead of conveying the workpiece. In the image forming device, when the workpiece has undulations (undulations in a vertical direction), there is a problem in that the illuminance of the light with which the workpiece is irradiated changes depending on the position as described above.

When the light irradiation device is installed in the image forming device, sometimes an error is generated due to a design value. In such cases, when the distance between the workpiece and the light irradiation device deviates from the design value, there is a problem in that the illuminance of the light with which the workpiece is irradiated deviates from the design value.

The present invention has been made in view of the above problems, and an object of the present invention is to provide a light irradiation device in which the illuminance of the light with which the workpiece is irradiated hardly changes even when the distance between the workpiece and the light irradiation device changes, and an image forming device including the light irradiation device.

Means for Solving the Problems

The inventors have found that the above problems can be solved by adopting the following configuration, and have completed the present invention.

According to one aspect of the present invention, a light irradiation device includes: an LED substrate on which a plurality of LED chips that emit ultraviolet rays are arrayed in a first direction; and a cover capable of transmitting the ultraviolet rays from the LED chips. Assuming that a reference plane $Z_1$ is a plane on which an intersection point where light from each of the LED chips located at both ends in the first direction reaches is located, the plane being parallel to an LED substrate surface, that D (mm) is a distance between the LED substrate surface and the reference plane $Z_1$, and that W (mm) is a distance between the LED substrate surface and a cover outside surface, W satisfies the following expression (1).

$$W<D \quad (1)$$

With this configuration, since the W satisfies the expression (1), the reference plane $Z_1$ is located below the cover outside surface (on the side away from the LED substrate). At this point, the illuminance at the central position M in the first direction is kept constant from the LED substrate surface to the reference plane $Z_1$, and the fluctuation in the illuminance is effectively prevented. Thus, for example, in the case where an expected workpiece passage position is set to a height position below the cover outside surface and above the reference plane $Z_1$, when the workpiece is moved in the first direction relative to the light irradiation device, the illuminance of the light with which the workpiece is irradiated does not change at the central position M even when the distance between the workpiece and the light irradiation device changes within this range (within the range below the cover outside surface and above the reference plane $Z_1$).

The illuminance at the central position M decreases with the distance from the lower side of the reference plane $Z_1$ (the side away from the LED substrate) in principle. However, in the present invention, the reference plane $Z_1$ is located far from the LED substrate. As a result, the reference plane $Z_1$ can be brought closer to the expected workpiece passage position as compared with the conventional device configuration. Consequently, the illuminance of light with which the workpiece is irradiated can be increased.

As described above, in the above configuration, when the expected workpiece passage position is set within a predetermined range from the reference plane $Z_1$, the fluctuation in the illuminance can effectively be prevented, and the decrease in the illuminance of the light with which the workpiece is irradiated can be prevented.

The change in illuminance at a place where the illuminance is high is significant immediately below the light irradiation device (a place where the illuminance is the highest in the conveyance direction), and a curing state of the UV ink is largely influenced at the place where the illuminance is the highest.

In the light irradiation device, assuming that a reference plane $Z_2$ is a plane on which an intersection point where light from each of the adjacent LED chips reaches is located, the plane being parallel to the LED substrate surface, and that d (mm) is a distance between the LED substrate surface and the reference plane $Z_2$, preferably W satisfies the following expression (2).

$$d<W \quad (2)$$

As will be described later with reference to FIG. 4, when the distance from the substrate at the central position is $0<d$, the illuminance unevenness is significantly large in the first direction. For this reason, when the W is less than or equal to d, a region where illuminance unevenness is significant in the first direction exists in a region below the cover. On the other hand, when the W is set larger than d, the existence of the significant illuminance unevenness in the first direction can be prevented in the region below the cover.

In the light irradiation device, a plurality of lenses corresponding to the LEDs may be arranged in front of the LED chips, and assuming that 2 L is a distance between the LEDs located at both ends in the first direction, and that θ is a divergence angle of the light emitted from each lens, the D may be a value obtained by the following equation (3).

$$D=L/\tan\theta \quad (3)$$

The D is an approximate expression calculating a distance D between the LED substrate surface and the reference plane $Z_1$ from an angle up to a region where an amount of light emitted from the lens becomes a half value based on a center in a light emitting surface of the LED chip. The approximate expression is not suitably applied for a large maximum separation distance $D_c$ between the LED chip and an outgoing surface of the lens. However, in a range of at least $D_c/D \leq 0.1$, design of the present invention can easily be achieved using the D obtained by the above equation (3).

In the light irradiation device, the LED chips may be arranged in a matrix form on the LED substrate, and the distance between both ends of the plurality of LED chips arrayed in the first direction (the distance between the LED chips located at both ends) may be shorter than a distance between both ends of the plurality of LED chips arrayed in a second direction orthogonal to the first direction.

The fluctuation in the maximum illuminance can be prevented by applying the first direction (short direction) to the workpiece conveyance direction. Consequently, for example, the variation in the curing of the ink can suitably be prevented by installing the light irradiation device of the present invention in the image forming device.

In the light irradiation device, preferably a difference (D−W) between the D and the W is greater than or equal to 3 mm. This is a value based on the practical minimum separation distance between the workpiece and the light irradiation device in the image forming device.

When the difference (D−W) is greater than or equal to 3 mm, it is possible to sufficiently cope with the change in the illuminance that can actually be generated in an actual machine.

According to another aspect of the present invention, an image forming device includes: an ejection device that ejects UV ink curable by ultraviolet rays; the light irradiation device; and a workpiece placement unit located on an ultraviolet ray emitting surface side of the light irradiation device. Assuming that Y (mm) is the distance between the LED substrate surface and a mounting surface of the workpiece placement unit, Y satisfies the following expression (4).

$$W<Y<2D \quad (4)$$

With this configuration, when the Y satisfies the expression (4), the expected workpiece passage position is located above the point at a distance of 2D from the LED substrate surface and below the cover outside surface. Consequently, the expected workpiece passage position can be disposed within a predetermined range from the reference plane $Z_1$, the fluctuation in the illuminance is effectively prevented, and the workpiece can be caused to pass within the range where the high illuminance is maintained, so that the illuminance of the light with which the workpiece is irradiated can be increased.

In the image forming device, the light irradiation device may be disposed such that a workpiece conveyance direction is matched with the first direction.

When the workpiece is disposed such that the workpiece conveyance direction is matched with the first direction, the fluctuation in the maximum illuminance can be prevented. Consequently, the variation in the curing of the ink can suitably be prevented.

Effect of the Invention

In the present invention, the light irradiation device in which the illuminance of the light with which the workpiece is irradiated hardly changes even when the distance between the workpiece and the light irradiation device changes and the image forming device including the light irradiation device can be provided.

MODE FOR CARRYING OUT THE INVENTION

Hereinafter, a light irradiation device and an image forming device according to an embodiment of the present invention will be described with reference to the drawings. Because the light irradiation device of the embodiment is included in the image forming device of the embodiment, the light irradiation device will be described in the description of the image forming device.

Figure 1:
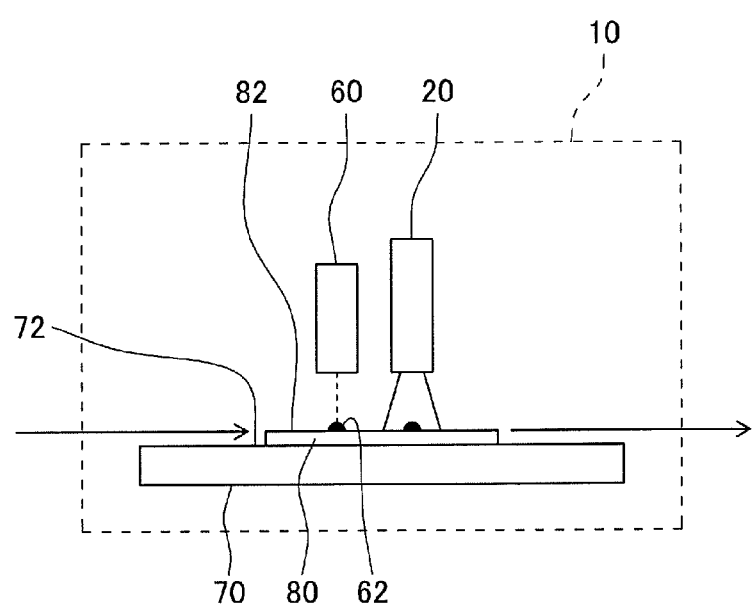
FIG. 1 is a schematic diagram illustrating an image forming device according to an embodiment.

FIG. 1 is a schematic diagram illustrating the image forming device of the embodiment. As illustrated in FIG. 1, an image forming device 10 of the embodiment includes a light irradiation device 20, an ejection device 60, and a workpiece placement unit 70.

In the image forming device 10, a workpiece 80 is conveyed on a mounting surface 72 located on an upper side of the workpiece placement unit 70. In FIG. 1, the workpiece 80 is conveyed from the left side (upstream side) to the right side (downstream side).

The ejection device 60 is disposed on the upstream side in a conveyance direction, and ejects UV ink 62 onto a surface 82 of the conveyed workpiece 80.

The light irradiation device 20 is disposed on the downstream side of the ejection device 60 in the conveyance direction, and irradiates the UV ink 62 with ultraviolet rays to cure the UV ink 62.

The workpiece 80 is a target to be printed by UV ink, and is not particularly limited. For example, paper, a disk such as a CD, a DVD, and a Blu-ray disk, and a plastic plate can be cited as the workpiece 80.

Figure 2:
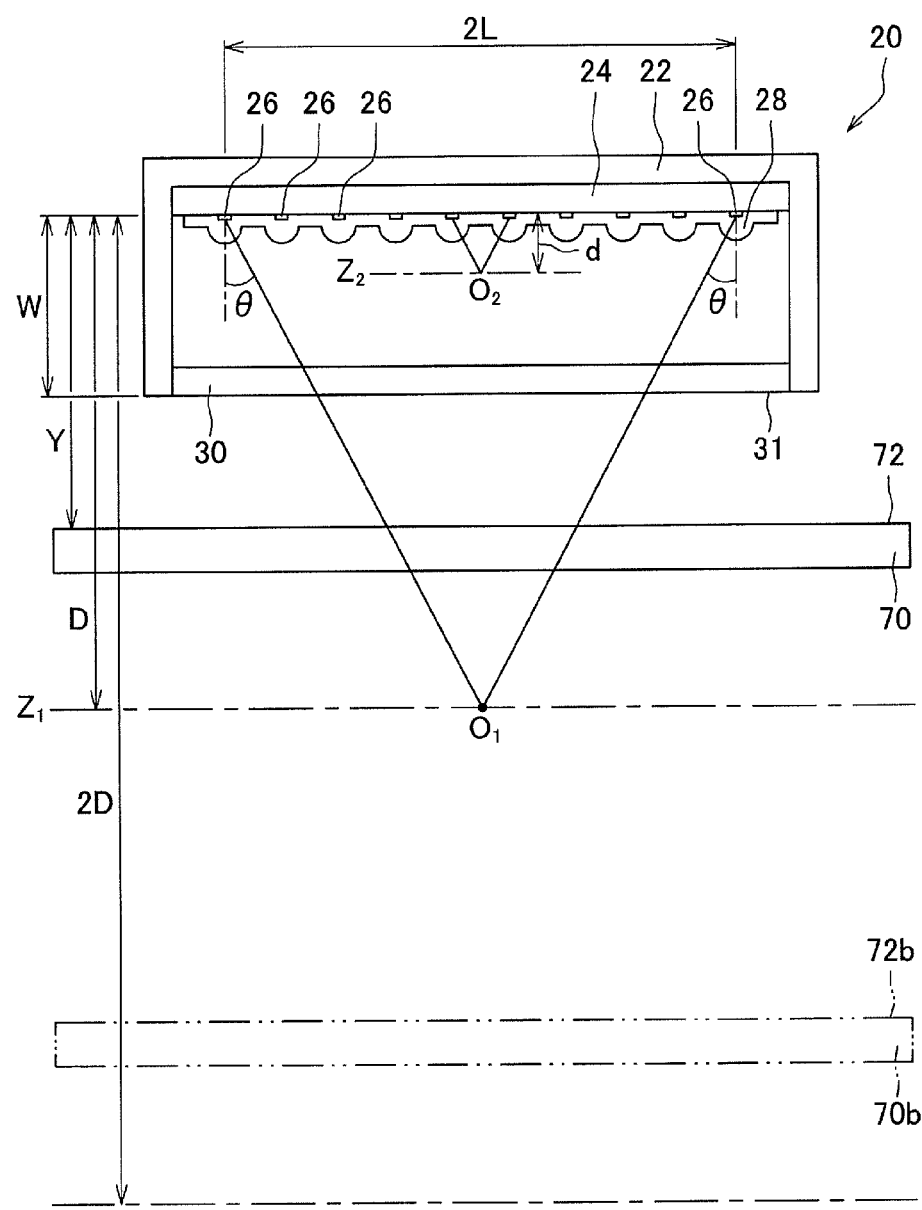
FIG. 2 is a sectional view of a light irradiation device in FIG. 1.

FIG. 2 is a sectional view of the light irradiation device in FIG. 1. In FIG. 2, the workpiece 80 is conveyed from the left side to the right side of the drawing plane similarly to FIG. 1. FIG. 2 also illustrates the workpiece placement unit 70. As illustrated in FIG. 2, the light irradiation device 20 includes a chassis 22, an LED substrate 24 provided inside and in an upper portion of the chassis 22, and a cover 30 provided so as to cover a lower surface of the chassis 20. A material for the cover 30 is not particularly limited as long as the material transmits the ultraviolet rays to some extent, and a UV-resistant resin such as a silicone resin and a Teflon (registered trademark) resin and glass can be cited as the material.

Figure 3:
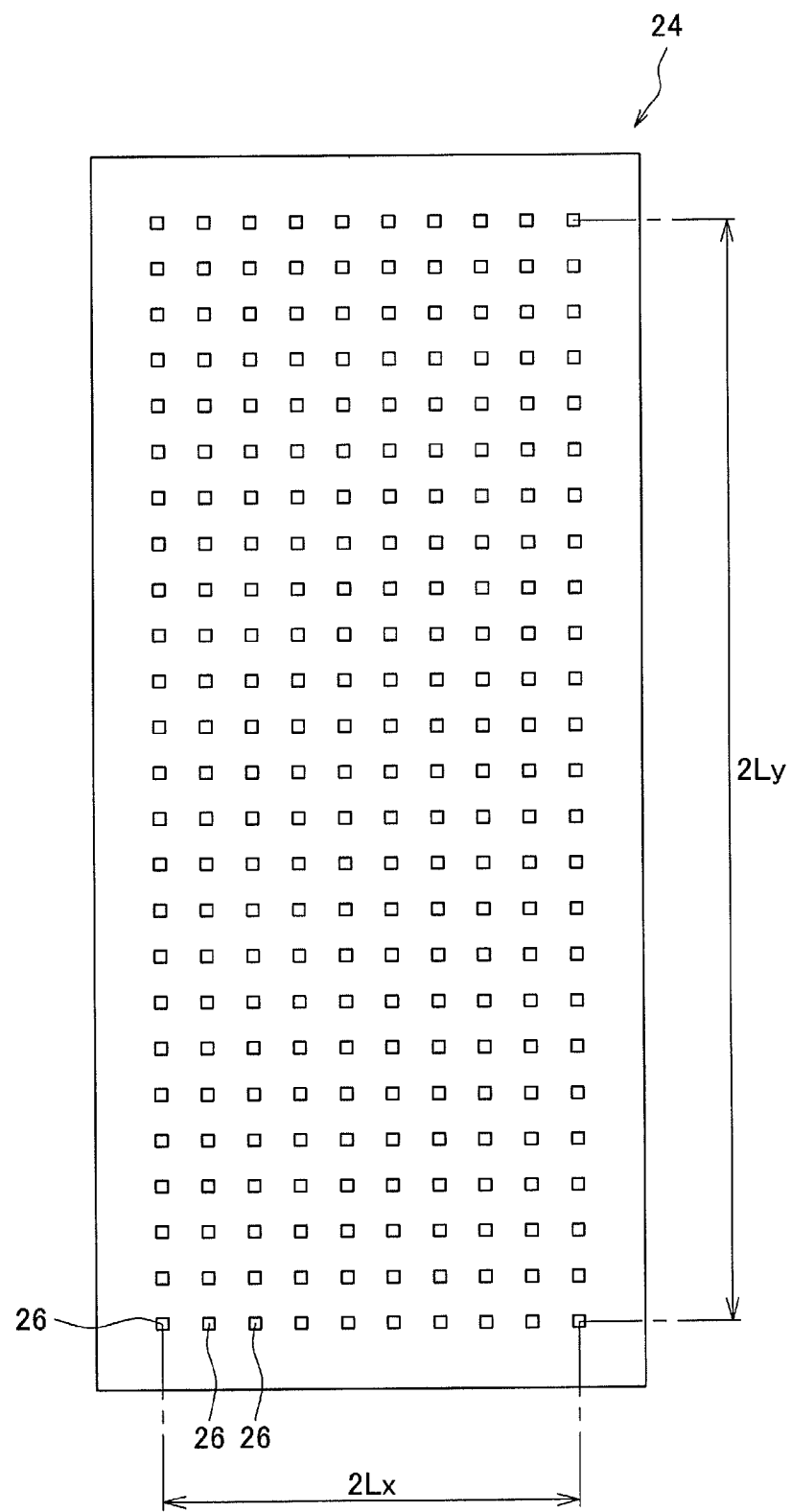
FIG. 3 is a bottom view of an LED substrate in FIG. 2.

FIG. 3 is a bottom view of the LED substrate in FIG. 2. In FIG. 3, lenses 28 in FIG. 2 are omitted. As illustrated in FIG. 3, a plurality of LED chips 26 are provide in a matrix form in the LED substrate 24. Specifically, ten LED chips 26 in a short direction and 25 LED chips 26 in a longitudinal direction of the LED substrate 24 are arranged at regular intervals in the matrix form. In the LED substrate 24, a distance 2Lx between both ends of the plurality of LED chips 26 arranged in the short direction is shorter than a distance 2Ly between both ends of the plurality of LED chips 26 arranged in the longitudinal direction orthogonal to the short direction. In the embodiment, the light irradiation device 20 is disposed in the image forming device 10 such that the short direction of the light irradiation device 20 is matched with a workpiece conveyance direction. The short direction in the embodiment corresponds to the first direction of the present invention. The longitudinal direction in the embodiment corresponds to the second direction of the present invention. In the embodiment, the light irradiation device 20 is disposed such that the workpiece conveyance direction is matched with the short direction, so that a fluctuation in maximum illuminance in a height direction can be prevented.

As illustrated in FIG. 2, the plurality of lenses 28 corresponding to the respective LEDs 26 are arranged in front of the LED chips 26 (below the LED chips 26 in FIG. 2). In the embodiment, the plurality of lenses 28 are integrally formed. For example, a method for injection molding an integrally molded product of the plurality of lenses 28 on the LED chips 26 of the LED substrate 24 as the LED substrate 24 on which the LED chips 26 are arranged as an insert component can be cited as a method for disposing the lenses 28 in front of the LED chips 26. In this case, preferably resin suitable for the injection molding is used as the material for the lens 28. The resin is not particularly limited as long as the resin transmits the ultraviolet rays to some extent, and a silicone resin can be cited as an example of the resin. However, the lens of the present invention is not limited to this example, and an individual lens may be provided in front of each LED chip.

In the light irradiation device 20, a plane (reference plane $Z_1$) on which an intersection point $O_1$ at which light from each LED chip 26 located at both ends in the workpiece conveyance direction reaches is located, the plane being parallel to the surface of the LED substrate 24, is located below an outside surface 31 of the cover 30 (the side away from the LED substrate 24). That is, assuming that D (mm) is the distance between the surface of the LED substrate 24 and the reference plane $Z_1$, and that W (mm) is the distance between the surface of the LED substrate 24 and the outside surface 31 of the cover 30, W satisfies the following expression (1).

$$W < D \qquad (1)$$

Figure 4:
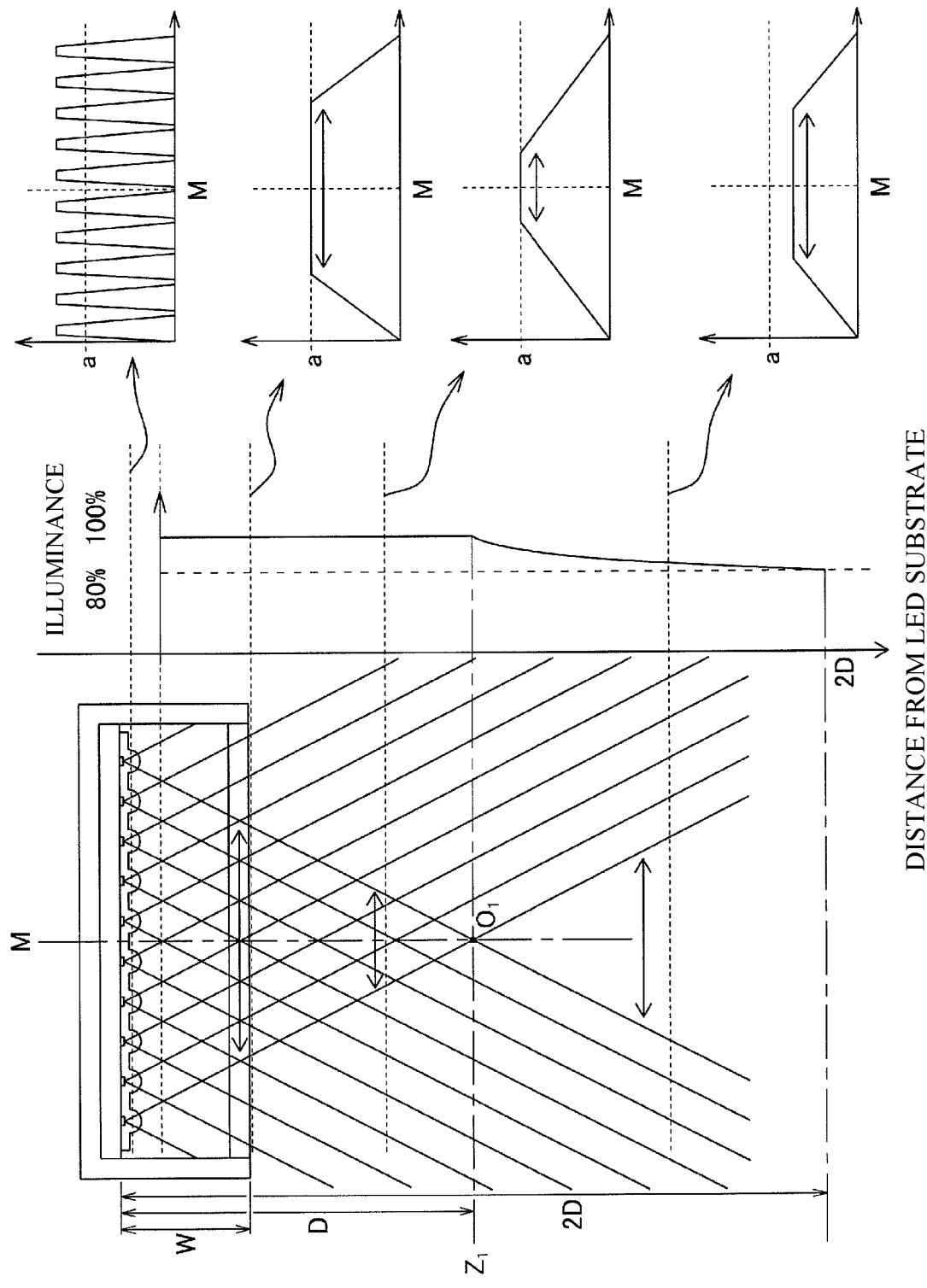
FIG. 4 is a view illustrating a relationship between a distance from the LED substrate and illuminance at a central position in a short direction in the light irradiation device in FIG. 2.

FIG. 4 is a view illustrating a relationship between a distance from the LED substrate and illuminance at a central position in the short direction in the light irradiation device in FIG. 2. FIG. 4 includes a graph illustrating a relationship between a distance from the LED substrate 24 and illuminance at a central position M (a central position M in the workpiece conveyance direction) of the LED substrate 24 together with a schematic diagram of the light irradiation device 20. FIG. 4 also includes a graph illustrating a change in illuminance in the first direction together with the schematic diagram. In the graph, the distance from the substrate is expressed so as to be matched with the distance from the LED substrate 24 of the illustrated light irradiation device 20. As can be seen from the graph, the illuminance at the central position M is kept constant from the surface of the LED substrate 24 to the reference plane $Z_1$. On the other hand, below the reference plane $Z_1$ (on the side away from the LED substrate 24), the illuminance decreases according to the distance.

In the image forming device 10, assuming that Y (mm) is the distance between the surface of the LED substrate 24 and the mounting surface of the workpiece placement unit 70, Y satisfies the following expression (4).

$$W<Y<2D \qquad (4)$$

In the image forming device 10 of the embodiment, as illustrated in FIG. 2, the mounting surface 72 of the workpiece placement unit 70 is disposed so as to be located below the cover outside surface 31 and above the reference plane $Z_1$. That is, the mounting surface 72 is disposed such that Y satisfies W<Y≤D. Thus, in conveying the workpiece 80, the illuminance of the light with which the workpiece 80 is irradiated does not change at the central position M even when the distance between the workpiece 80 and the light irradiation device 20 changes within the range (within the range below the cover outside surface 31 and above the mounting surface 72).

The image forming device of the embodiment also exhibits excellent effects by satisfying the expression (4). That is, although in the embodiment, the mounting surface 72 of the workpiece placement unit 70 is disposed so as to be located below the cover outside surface 31 and above the reference plane $Z_1$, the present invention is not limited to the embodiment. For example, as indicated by a two-dot chain line in FIG. 2, the mounting surface (mounting surface 72b) of the workpiece placement unit (workpiece placement unit 70b) may be disposed above the point at a distance of 2D from the surface of the LED substrate 24 and below the cover outside surface 31. That is, the workpiece placement surface may be located within a range where Y satisfies D<Y<2D. When the mounting surface 72b of the workpiece placement unit 70b is located above the point at the distance of 2D from the surface of the LED substrate 24, the illuminance of 80% is obtained with respect to the maximum illuminance at the central position M, and it can be said that a rate of decline of the illuminance falls within an allowable range. Since the reference plane $Z_1$ is located away from the LED substrate surface in this way, the reference plane $Z_1$ and the expected workpiece passage position can be brought close to each other, and the change in the illuminance of the light with which the workpiece is irradiated can be prevented. Thus, even when the mounting surface 72b of the workpiece placement unit 70b is located above the point at the distance of 2D from the LED substrate 24 and below the cover outside surface 31, and even when the distance between the workpiece 80 and the light irradiation device 20 changes, the change in the illuminance of the light with which the workpiece 80 is irradiated falls within a limited range.

As described above, in the image forming device of the embodiment, assuming that Y (mm) is the distance between the LED substrate surface and the mounting surface of the workpiece placement unit, Y only needs to satisfy the expression (4).

In the image forming device 10, as illustrated in FIG. 2, assuming that the reference plane $Z_2$ is a plane on which an intersection point $O_2$ where light from each of the adjacent LED chips reaches is located, the plane being parallel to the LED substrate surface, and that d (mm) is a distance between the LED substrate surface and the reference plane $Z_2$, preferably W satisfies the following expression (2).

$$d<W \qquad (2)$$

As will be described later with reference to FIG. 4, when the distance from the substrate at the central position M satisfies 0<d, the illuminance unevenness is significantly large in the conveyance direction. For this reason, when the W is less than or equal to d, the region where the illuminance unevenness is significant in the conveyance direction exists in the region below the cover 30. On the other hand, when W is made larger than d, a place having uneven illuminance in the conveyance direction can largely be reduced in a region below the cover 30.

At this point, preferably a difference (D−W) between D and W is greater than or equal to 3 mm, and more preferably the difference (D−W) is greater than or equal to 5 mm. When the difference (D−W) is greater than or equal to 3 mm, it is possible to sufficiently cope with the change in the illuminance that can actually be generated in an actual machine. Specifically, for example, in the case where the difference (D−W) is set to 3 mm while the mounting surface 72 of the workpiece placement unit 70 is located on the reference plane $Z_1$, the illuminance can be uniformized when the flutter of the workpiece has the fluctuation range of 3 mm or less.

It can be said that the light irradiation device of the present invention is particularly superior in a UV printing device. When the UV ink is irradiated with the ultraviolet rays, the photopolymerization initiator in the UV ink absorbs the ultraviolet rays, and decomposes to generate an active species. The active species reacts with the monomer to generate a new active species; repetition of this reaction polymerizes a monomer to generate a polymer, and the polymer is solidified and fixed. The UV ink is cured by the polymerization reaction. A curing degree of the UV ink is determined by a total energy amount (integrated light amount) with which the UV ink is irradiated. On the other hand, even when the integrated light amount is kept constant, the curing degree changes depending on the difference in the maximum illuminance. For example, the change in the illuminance affects the variation in the curing degree of the UV ink because the polymerization reaction is inhibited (oxygen inhibition), and the UV ink is hardly cured when oxygen interferes with the polymerization reaction process of the UV ink. For this reason, the inventors consider that it is necessary to keep the maximum illuminance constant in order to perform the ink curing within a desired range without variation.

As illustrated in FIG. 4, in the light irradiation device of the present invention, the light curing can be performed in the region where the maximum illuminance is hardly changed even when the fluctuation exists in the height direction, which allows the ink curing to be stably performed in the desired range.

The graph in FIG. 4 illustrating the change in the illuminance in the first direction is based on the assumption that the light is emitted from each LED chip 26 with ideal light distribution having no unevenness in emission intensity. However, in practice, sometimes the emission intensity of the light emitting surface of the LED chip varies depending on the location, and the unevenness in the emission intensity is usually generated depending on a shape of an electrode or a wiring pattern formed on the light emitting surface. Even when the W is set larger than d, the unevenness in the light distribution caused by each LED chip can hardly be eliminated. For this reason, more preferably the W satisfies 2d<W, and further preferably the W satisfies 3d<W. Consequently, the reference plane $Z_2$ is disposed away from the LED substrate surface, a light mixing property of the light from respective LED chips is enhanced, and the unevenness in the light distribution due to the LED chips can suitably be prevented.

Assuming that the reference plane $Z_1$ is a plane on which the intersection point where the light from each of the LED chips located at both ends in the first direction reaches is located, the plane being parallel to the LED substrate surface, that D (mm) is the distance between the LED substrate surface and the reference plane $Z_1$, and that W (mm) is the distance between the LED substrate surface and the cover outside surface, the light irradiation device of the present invention has the configuration satisfying the relationship of W<D. For example, this device configuration can easily be determined by the following means.

Figure 5:
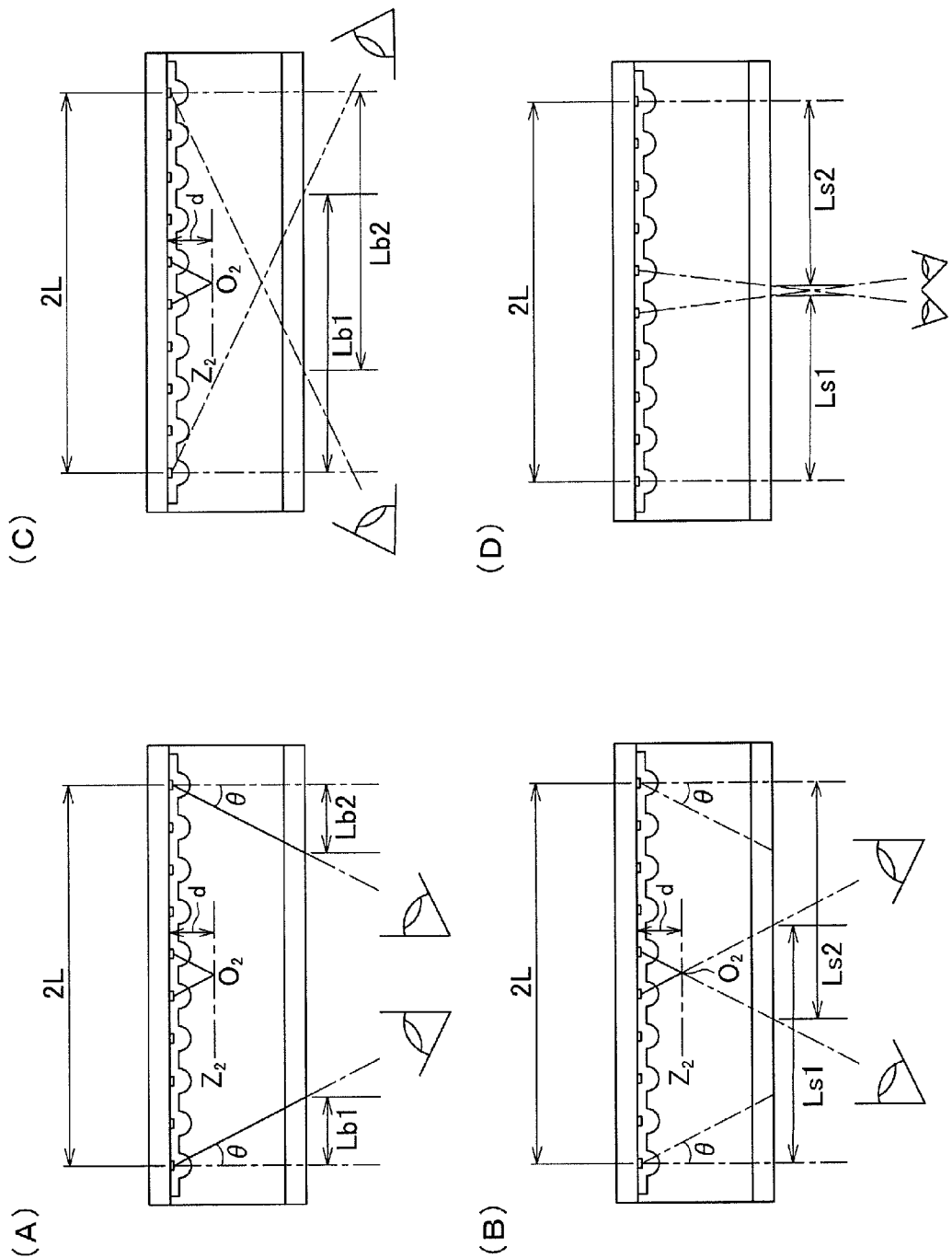
FIG. 5 is a schematic diagram illustrating a method for determining whether to have the configuration of the present invention.

FIG. 5 is a schematic diagram illustrating a method for determining whether to have the configuration of the present invention.

The range where the light from the LED reaches can be approximated as the range where the LED light emitting surface can visually be observed. For example, in FIG. 5(A), a distance (Lb1, Lb2) until the LED light emitting surface reflected in the lens becomes invisible when the LED chip located at the end is visually observed from the outside of the cover outside surface corresponds to the range where the light can reach from the LED chip. When the configuration satisfies Lb1<L, Lb2<L, it can be determined that the reference plane $Z_1$ is located outside the cover outside surface, and it can be determined that the relationship of W<D is satisfied. FIG. 5(B) illustrates a method for determining whether to satisfy the relationship of d<W. When two adjacent LED chips are viewed, it can be determined that the relationship is satisfied when the relationship of Ls1>L, Ls2>L is satisfied. For determining whether to satisfy the relationship of 2d<W, the determination can be made based on the same determination method as described above as to the LED chips located at both ends when three adjacent LED chips are viewed.

FIGS. 5(C) and 5(D) illustrate conceptual diagrams as an example in which the device configuration of the present invention is not provided.

The above description is an example of the simple determination method. The simple determination method is adopted when the determination that the configuration of the present invention is provided can clearly be made by the simple determination method. However, when whether to have the configuration of the present invention is unclear in this simple determination method, a determination method other than the above simple determination method may be adopted. In this case, for the range of $D_c/D \leq 0.1$, whether to satisfy W<D is determined using the D as a value obtained by the above equation (3).

Figure 6:
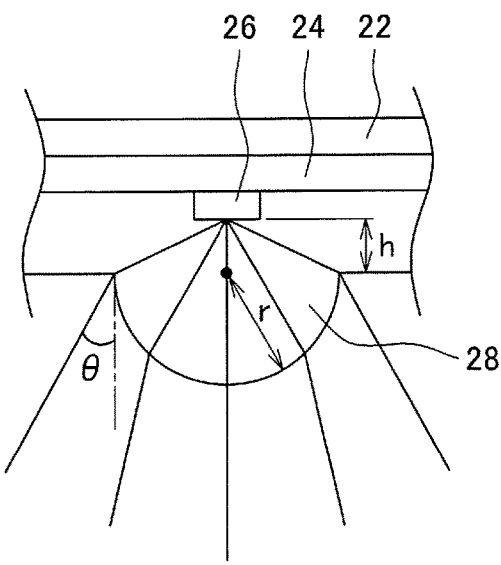
FIG. 6 is a partially enlarged view of the LED substrate.
Figure 7:
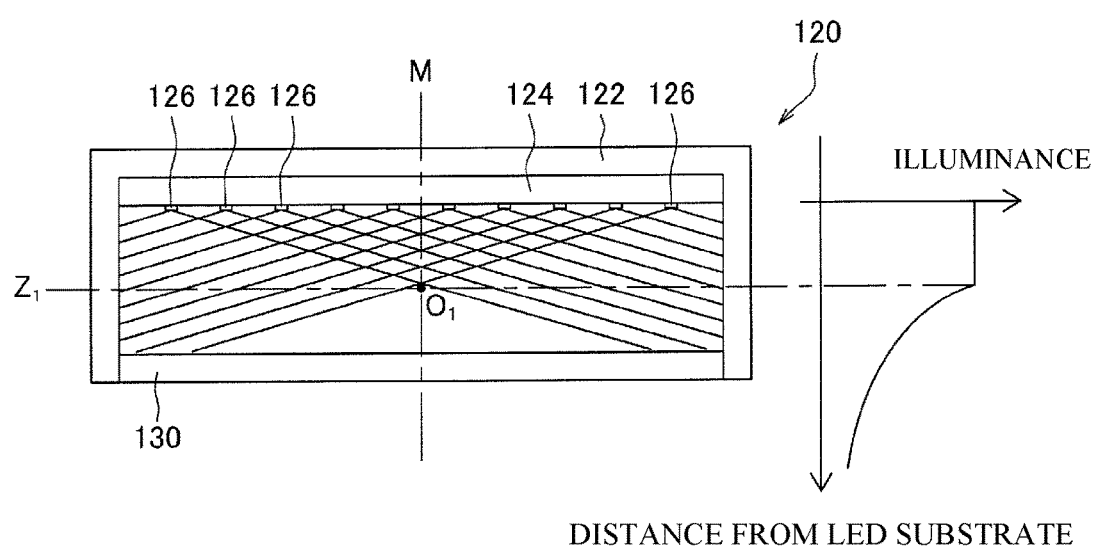
FIG. 7 is a sectional view illustrating a light irradiation device included in a conventional image forming device.

FIG. 6 is a partially enlarged view of the LED substrate. As illustrated in FIG. 6, the center of the lens 28 is located in front of the light emitting surface of the LED chip 26 by h (mm). The radius of the lens 28 is r (mm). The divergence angle of the light emitted from the lens 28 is θ. The refractive index of the lens 28 is n.

In the embodiment, assuming that 2 L (corresponding to 2Lx in FIG. 3) is the distance between the LEDs located at both ends in the short direction, the D may be a value obtained by the following equation (3).

$$D = L/\tan\theta \qquad (3)$$

The D is an approximate expression calculating a distance D between the LED substrate surface and the reference plane $Z_1$ from an angle up to a region where an amount of light emitted from the lens becomes a half value based on a center in a light emitting surface of the LED chip. The approximate expression is not suitably applied for a large maximum separation distance $D_c$ between the LED chip and an outgoing surface of the lens. However, in a range of at least $D_c/D \leq 0.1$, design of the present invention can easily be achieved using the D obtained by the above equation (3).

As described above, in the image forming device 10 of the embodiment, because the Y satisfies the expression (4), the expected passage position of the workpiece 80 is located above the point at the distance of 2D from the surface of the LED substrate 24 and below the cover outside surface 31. Thus, because the workpiece 80 passes through this region, even when the distance between the workpiece 80 and the light irradiation device 20 changes from the expected passage position (for example, even when the workpiece 80 flutters at the central position M), the illuminance of the light with which the workpiece 80 is irradiated can hardly be changed.

In the light irradiation device 20 of the embodiment, because the W satisfies the above expression (1), when the light irradiation device 20 is installed in the image forming device 10 such that the expected passage position of the workpiece 80 is located within a predetermined range from the reference plane $Z_1$, the illuminance of the light with which the workpiece 80 is irradiated can hardly be changed even when the distance between the workpiece 80 and the light irradiation device 20 changes from the expected passage position.

In the description of the embodiment, the ten LED chips 26 are arranged at equal intervals in the first direction (short direction) of the LED substrate 24. However, in the present invention, the number of LED chips arranged in the first direction is not particularly limited as long as the number of LED chips is greater than or equal to three. Chip intervals of the LED chips arranged in the first direction may be equal to or be different from each other. For example, a mode in which the chip interval is narrowed from the central position toward the end or a mode in which the chip interval is widened from the central position toward the end may be used. When the chip intervals of the LED chips arranged in the first direction are equal to each other, the d may be obtained as an average value of a plurality of d values obtained from an intersection point $O_2$ of the adjacent chips.

In the description of the embodiment, the 25 LED chips 26 are arranged at equal intervals in the second direction (longitudinal direction) of the LED substrate 24. However, in the present invention, the number of LED chips arranged in the second direction is not particularly limited as long as the number of LED chips is greater than or equal to two. The chip intervals of the LED chips arranged in the second direction may be equal to each other, may be narrowed from the central position toward the end in the second direction, or may be widened from the central position toward the end.

In description of the embodiment, the first direction and the second direction are different from each other in the distance between both ends of the LED chips. However, the present invention is not limited to the embodiment, and the first direction and the second direction may be identical to each other in the distance between both ends of the LED chips. However, preferably the first direction and the second direction are different from each other in the distance between both ends of the LED chips.

In the description of the embodiment, the image forming device has the configuration in which the printing is performed while the workpiece is conveyed. However, the image forming device of the present invention is not limited to the embodiment. Alternatively, such an image forming device may be employed that the workpiece is not conveyed but is placed on the mounting surface of the placement unit, and the printing is performed while the ejection device and the light irradiation device are moved.

In the embodiment, as an example of a preferable combination of numerical ranges include, for example, h (mm) ranges from 0.2 to 2, r (mm) ranges from 0.5 to 2, n ranges from 1.3 to 1.6, θ ranges from 30 degrees to 60 degrees, 2 L (mm) ranges from 10 to 40, and the number of chips in the first direction (short direction) ranges from 5 to 30. The use of the combination of the numerical ranges can provide the light irradiation device in which the effects of the present invention can more easily be obtained.

As described above, the embodiment of the present invention is described. However, the present invention is not limited to the embodiment, and the design changes can appropriately be made within a range that satisfies the configuration of the present invention.

DESCRIPTION OF REFERENCE SIGNS 10 image forming device
20 light irradiation device
24 LED substrate
26 LED chip
28 lens
30 cover
31 outside surface
60 ejection device
62 UV ink
70 workpiece placement unit
72 mounting surface
80 workpiece
82 surface

The invention claimed is:

1. A light irradiation device comprising:
an LED substrate on which a plurality of LED chips that emit ultraviolet rays are arrayed in a first direction; and
a cover capable of transmitting the ultraviolet rays from the LED chips,
wherein a following expression (1) is satisfied:

$$W<D \quad (1)$$

where a reference plane $Z_1$ is a plane on which an intersection point where light from each of the LED chips located at both ends in the first direction reaches is located, the plane being parallel to an LED substrate surface,
D is a distance between the LED substrate surface and the reference plane $Z_1$,
W is a distance between the LED substrate surface and a cover outside surface,
and
a unit of D and W is expressed in millimeter, and
wherein the LED chips are arranged in the first direction and a second direction orthogonal to the first direction on the LED substrate, and the distance between both ends of the plurality of LED chips arrayed in the first direction is shorter than a distance between both ends of the plurality of LED chips arrayed in the second direction.

2. The light irradiation device according to claim 1, wherein assuming that a reference plane $Z_2$ is a plane on which an intersection point where light from each of the adjacent LED chips reaches is located, the plane being parallel to the LED substrate surface, and that d (mm) is a distance between the LED substrate surface and the reference plane $Z_2$, W satisfies the following expression (2):

$$d<W \quad (2).$$

3. The light irradiation device according to claim 1, wherein a plurality of lenses corresponding to the LEDs are arranged in front of the LED chips, and
assuming that 2 L is a distance between the LEDs located at both ends in the first direction, and that θ is a divergence angle of the light emitted from each lens, the D is a value obtained by the following equation (3):

$$D=L/\tan θ \quad (3).$$

4. The light irradiation device according to claim 1, wherein a difference (D−W) between the D and the W is greater than or equal to 3 mm.

5. An image forming device comprising:
an ejection device that ejects UV ink curable by ultraviolet rays;
the light irradiation device according to claim 1; and
a workpiece placement unit located on an ultraviolet ray emitting surface side of the light irradiation device,
wherein assuming that Y (mm) is a distance between the LED substrate surface and a mounting surface of the workpiece placement unit, Y satisfies the following expression (4):

$$W<Y<2D \quad (4).$$

6. The image forming device according to claim 5, wherein the light irradiation device is disposed such that a workpiece conveyance direction is matched with the first direction.

7. A light irradiation device comprising:
an LED substrate on which a plurality of LED chips that emit ultraviolet rays are arrayed in a first direction; and
a cover capable of transmitting the ultraviolet rays from the LED chips, wherein
the number of LED chips arranged in the first direction is greater than or equal to three,
wherein a following expression (1) is satisfied:

$$W<D \quad (1)$$

where a reference plane $Z_1$ is a plane on which an intersection point where light from each of the LED chips located at both ends in the first direction reaches is located as a point, the plane being parallel to an LED substrate surface,
D is a distance between the LED substrate surface and the reference plane $Z_1$,
W is a distance between the LED substrate surface and a cover outside surface,
and
a unit of D and W is expressed in millimeter,
the LED chips are arranged in the first direction and a second direction orthogonal to the first direction on the LED substrate, and the distance between both ends of the plurality of LED chips arrayed in the first direction is shorter than a distance between both ends of the plurality of LED chips arrayed in the second direction.

* * * * *